(12) United States Patent
Chou et al.

(10) Patent No.: US 9,442,135 B2
(45) Date of Patent: Sep. 13, 2016

(54) METHOD OF MANUFACTURING SPACE TRANSFORMER FOR PROBE CARD

(71) Applicant: MPI CORPORATION, Chu-Pei, Hsinchu Shien (TW)

(72) Inventors: Kuan-Chun Chou, Chu-Pei (TW); Huo-Kang Hsu, Chu-Pei (TW); Hui-Pin Yang, Chu-Pei (TW); Chien-Kuei Wang, Chu-Pei (TW)

(73) Assignee: MPI CORPORATION, Chu-Pei, Hsinchu Shien (TW)

( * ) Notice: Subject to any disclaimer, the term of this patent is extended or adjusted under 35 U.S.C. 154(b) by 246 days.

(21) Appl. No.: 14/224,727

(22) Filed: Mar. 25, 2014

(65) Prior Publication Data
US 2014/0290053 A1    Oct. 2, 2014

(30) Foreign Application Priority Data

Mar. 26, 2013  (TW) .............................. 102110741 A (51) Int. Cl.
*H05K 3/20* (2006.01)
*G01R 3/00* (2006.01)
*G01R 1/073* (2006.01)

(52) U.S. Cl.
CPC .............. *G01R 3/00* (2013.01); *G01R 1/07378* (2013.01); *Y10T 29/49128* (2015.01)

(58) Field of Classification Search
CPC  G01R 3/00; G01R 1/06744; G01R 31/2889; G01R 1/07378; Y10T 259/49128; Y10T 29/49147; Y10T 29/49155
USPC .......................... 29/830, 831, 841, 846, 852; 324/754.07, 762.01
See application file for complete search history.

(56) References Cited

U.S. PATENT DOCUMENTS

| 7,251,884 | B2 * | 8/2007 | Grube ..................... H01L 24/80 29/842 |
| 7,733,102 | B2 * | 6/2010 | Cheng ................ G01R 1/06744 324/762.01 |
| 7,872,482 | B2 * | 1/2011 | Chong ............... G01R 31/2889 324/754.07 |

FOREIGN PATENT DOCUMENTS

| KR | 20110020098 A | 3/2011 |
| TW | 200609516 A | 3/2006 |
| TW | 200846671 A | 12/2008 |

* cited by examiner

*Primary Examiner* — Donghai D Nguyen
(74) *Attorney, Agent, or Firm* — Muncy, Geissler, Olds & Lowe, P.C.

(57) ABSTRACT

A method of manufacturing a space transformer for a probe card includes the steps of mounting and electrically connecting second substrates on a first substrate, forming an insulated layer with through holes on each of the second substrates, and forming electrically conductive blocks in the through holes, respectively. Because the electrically conductive blocks are formed after the second substrates are mounted to the first substrate, any unexpected relative displacement of the first and second substrates during mounting is uninfluential to positions of the electrically conductive blocks. Besides, a step of planarizing the electrically conductive blocks can be further carried out. Therefore, the positions and flatness of probe needles may not need to be adjusted after the probe needles are connected with the electrically conductive blocks of the space transformer thus obtained.

14 Claims, 5 Drawing Sheets

METHOD OF MANUFACTURING SPACE TRANSFORMER FOR PROBE CARD

CROSS-REFERENCE TO RELATED APPLICATIONS

This application claims priority from Taiwan Patent Application No. 102110741 filed on Mar. 26, 2013, the entire content of which is incorporated herein by reference.

BACKGROUND OF THE INVENTION

1. Field of the Invention

The present invention relates generally to space transformers for probe cards and more particularly, to a method of manufacturing a space transformer for a probe card.

2. Description of the Related Art

A probe card usually comprises a main circuit board to be electrically connected with signal-transmitting contacts of a testing apparatus directly, arid a space transformer (hereinafter referred to as "ST") mounted to a bottom surface of the main circuit board. The space transformer is provided at a top surface thereof with a plurality of top contact pads adapted for being electrically connected with the main circuit board, and at a bottom surface thereof with a plurality of bottom contact pads adapted for being connected with a plurality of probe needles, respectively. The space transformer is designed in such a way that the bottom contact pads of the space transformer are arranged having an interval smaller than the interval of the top contact pads of the space transformer, so that the probe needles, which are connected with the bottom contact pads, will be also arranged with a relatively smaller interval and thereby capable of probing small-sized electronic components.

In general, the space transformer for the probe card is made of a multi-layered circuit board. By means of specific internal circuit layout in each layer of the circuit board, the space transformer having different intervals for the top contact pads and the bottom contact pads can be achieved. However, for this type of space transformer composed of a single circuit board with multi-layers, the space transformer usually needs to be made of a circuit board having a big number of layers and a certain large thickness, resulting in difficulty in manufacturing of such space transformer. Besides, this type of space transformer is usually customized made because the pattern of the contact pads of the space transformer needs to conform to the pattern of the contacts of the specific deices under test provided by the customer, resulting in increase of manufacturing cost.

Another type of commercially available space transformer is composed of a first substrate having a relatively larger area and a plurality of second substrates each having a relatively smaller area. The first substrate is provided at a top surface thereof with a plurality of top contact pads having a relatively larger interval, and at a bottom surface thereof with a plurality of bottom contact pads having a relatively smaller interval. Each of the second substrates is provided at a top surface thereof with a plurality of top contact pads corresponding in position to some of the bottom contact pads of the first substrate, and at a bottom surface thereof with a plurality of bottom contact pads having a relatively more smaller interval for being electrically and respectively connected with probe needles. By means of fixedly mounting the second substrates to the bottom surface of the first substrate in a way that the top contact pads of the second substrates are electrically connected to the bottom contact pads of the first substrate, a space transformer having two tiers is made. This type of space transformer can use relatively thinner circuit boards to serve as the first and second substrates, which are relatively easier in manufacturing. Besides, different space transformers for different devices under test can be made with different second substrates with first substrates of same specification, meaning that they can use the same first substrates.

In the aforesaid space transformer composed of a plurality of substrates arranged in two tiers, the second substrates are usually fixed to the first substrate by reflow soldering and the probe needles installed on the second substrates are adapted for probing a plurality of devices under test at the same time, For example, a plurality of die sites on a wafer, which are to be cut into single dies, can be treated as a plurality of devices under test, each of which is to be probed by the probe needles of a respective second substrate. This kind of the space transformer is a so-called multi-DUT (device under test) ST.

However, in the process of reflow soldering, the second substrates are liable to displace from predetermined positions. If the second substrates are indeed displaced from predetermined positions during reflow soldering, a problem that the probe needles on the second substrates may not be aligned with the electric contacts of the devices under test may happen. Besides, in the process of reflow soldering, the second substrates are liable to incline; in this event, the tips of the probe needles on the second substrates may not be located at a horizontal plane. Under these circumstances, it is needed to adjust the positions and flatness of the probe needles by a special adjusting apparatus after the probe needles are installed on the space transformer, resulting in increase of complexity in the probe card manufacturing process.

SUMMARY OF THE INVENTION

The present invention has been accomplished in view of the above-noted circumstances. It is an objective of the present invention to provide a method of manufacturing a space transformer for a probe card, which is adapted to manufacture the space transformer that is composed of a plurality of substrates in a two-tier format and not needed to adjust the positions and flatness of the probe needles to be installed thereon so as to simplify the manufacturing process of the probe card.

To attain the above objective, the present invention provides a method of manufacturing a space transformer for a probe card, which comprises steps of:

(a) mounting and electrically connecting a plurality of second substrates on a first substrate;

(b) forming an insulated layer having a plurality of through holes on each of the second substrates by photolithography; and (c) forming a plurality of electrically conductive blocks in the through holes respectively in a way that each of the electrically conductive blocks is fixedly bonded to and electrically connected with one of the second substrates.

Because the electrically conductive blocks are formed after the second substrates are mounted to the first substrate, any unexpected relative displacement of the first and second substrates during the mounting process is uninfluential to positions of the electrically conductive blocks. Therefore, as long as the positions of the through holes provided in the step (b) correspond to positions demanded for installation of probe needles, i.e. correspond to positions of contacts of a device to be tested, the electrically conductive blocks will be formed at positions exactly corresponding to the positions demanded for installation of probe needles. In this way, the positions of the probe needles will not need to be adjusted after installation of the probe needles on the electrically conductive blocks.

Besides, the aforesaid method may further comprise a step of planarizing the electrically conductive blocks after the step (c). In this way, even if the electrically conductive blocks are configured with different shapes or inclinations resulted from inclined second substrates, the electrically conductive blocks will have the parts that are to be connected with the probe needles be located on a horizontal plane after the planarization so as to prevent uneven distribution of the probing tips of the probe needles.

Preferably, in the aforesaid method, the first substrate may be a multi-layered ceramic board, and each of the second substrates may be a multi-layered organic board.

Preferably, in the aforesaid method, the electrically conductive blocks may he formed by electroplating in the step (c).

Preferably, in the aforesaid method, the step (c) may be carried out by disposing a conductor and a jig tool having at least one accommodating trough in a way that the conductor is electrically connected with the first substrate and covered by the jig tool, then introducing an electrolyte into the accommodating trough, and then forming the electrically conductive blocks in the through holes of the insulated layers by electroplating. More preferably, the jig tool may comprise an upper member and a lower member; in the step (c), the first substrate and the conductor are clamped between the upper member and the lower member.

Preferably, the first substrate and junctures of the first substrate and the second substrates may be covered by the jig tool in the step (c); in an embodiment of the present invention, the jig tool has a plurality of said accommodating troughs which are located on the insulated layers respectively in the step (e). In this way, the jig tool can prevent electrically connected parts of the first and second substrates and other electrically conductive parts of the first substrate from damage due to contact of the electrolyte. More preferably, the insulated layers may be pressed by the jig tool through a plurality of water-resisting members respectively in the. step (c) so that the electrolyte is prevented from flowing into the aforesaid parts requiring protection of the jig tool through gaps between the jig tool and the insulated layers.

In another embodiment of the present invention, the second substrates are accommodated in a single accommodating trough in the step (c). Preferably, the first substrate may be pressed by the jig tool through a water-resisting member in the step (c). In addition, the first substrate and each of the second substrates may be adhered with water-resisting glue in a way that the water-resisting glue seals junctures of the first substrate and the second substrates before the electrolyte is introduced into the accommodating trough in the step (c) so that the electrolyte is prevented from contact of the junctures of the first substrate and the second substrates. In this way, electrically connected parts of the first and second substrates can be protected by the water-resisting glue from damage due to contact of the electrolyte. However, if the aforesaid junctures have been filled with insulated underfill material, because protection of the electrically connected parts of the first and second substrates can be realized by the insulated underfill material, the water-resisting glue may be eliminated. Besides, other electrically conductive parts of the first substrate are protected by the jig tool from damage due to contact of the electrolyte. In addition, the water-resisting member can prevent the electrolyte from flowing into the aforesaid parts requiring protection of the jig tool through gaps between the jig tool and the first substrate.

Preferably, the aforesaid method may further comprise a step (d) of removing the insulated layers after the step (c).

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention, and wherein.

DETAILED DESCRIPTION OF THE INVENTION

Figure 1:
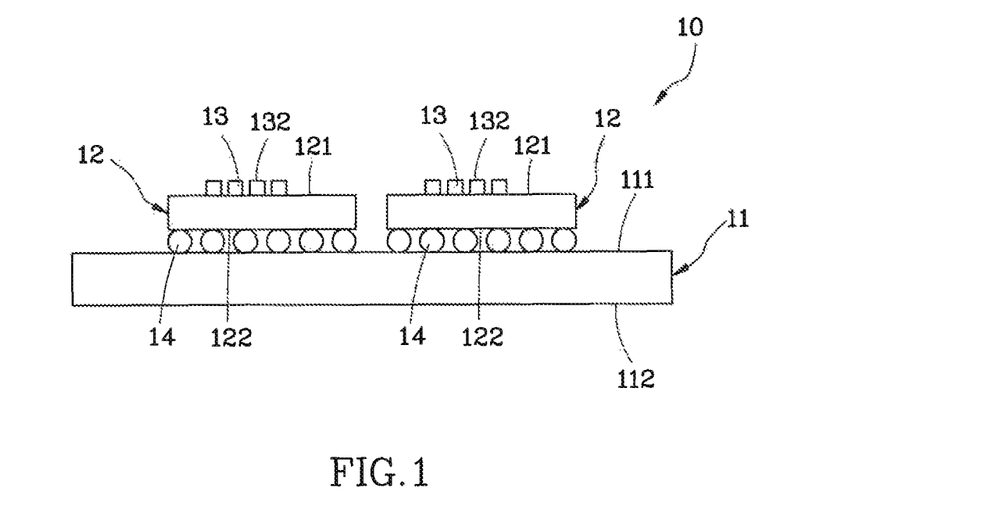
FIG. 1 is a schematic sectional view of a space transformer for a probe card according to a preferred embodiment of the present invention.

FIG. 1 is a schematic sectional view of a space transformer 10 according to a preferred embodiment of the present invention. As shown in FIG. 1, the space transformer 10 primarily comprises a first substrate 11, a plurality of second substrates 12, and a plurality of electrically conductive blocks 13 protruding from the second substrates 12.

Figure 2:
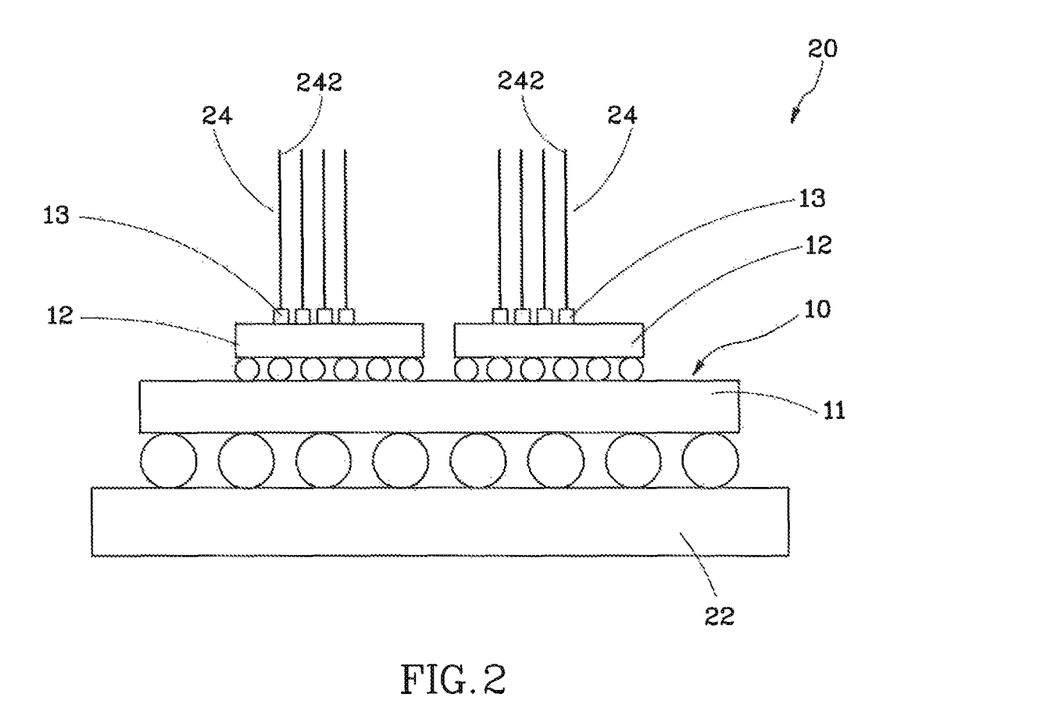
FIG. 2 is a schematic sectional view of the probe card having the space transformer according to the preferred embodiment of the present invention.

FIG. 2 is a schematic sectional view of a probe card 20 having the space transformer 10. As shown in FIG. 2, the first substrate 11 of the space transformer 10 is mounted on and electrically connected with a main circuit board 22, and the electrically conductive blocks 13 are connected with a plurality of probe needles 24, respectively The main circuit board 22 is adapted to be electrically connected with a testing apparatus (not shown) directly so that signals can be transferred between the probe needles 24 and the testing apparatus through the space transformer 10 and the main circuit board 22. The inventors of the present invention find and have confirmed that if the pattern of the electrically conductive blocks 13 is configured according to the pattern of the contacts of the devices (not shown) to be tested, the probe needles 24 will be arranged having a pattern conformable to the pattern the contacts of the devices to be tested after the probe needles 24 are respectively connected with the electrically conductive blocks 13. The present invention is primarily to provide a method of manufacturing a space transformer for realizing the aforesaid approach.

The method of manufacturing a space transformer for a probe card provided by the present invention will be described hereunder by taking the space transformer 10 as an example. The method of manufacturing the space transformer 10 comprises the following steps.

Figure 3:
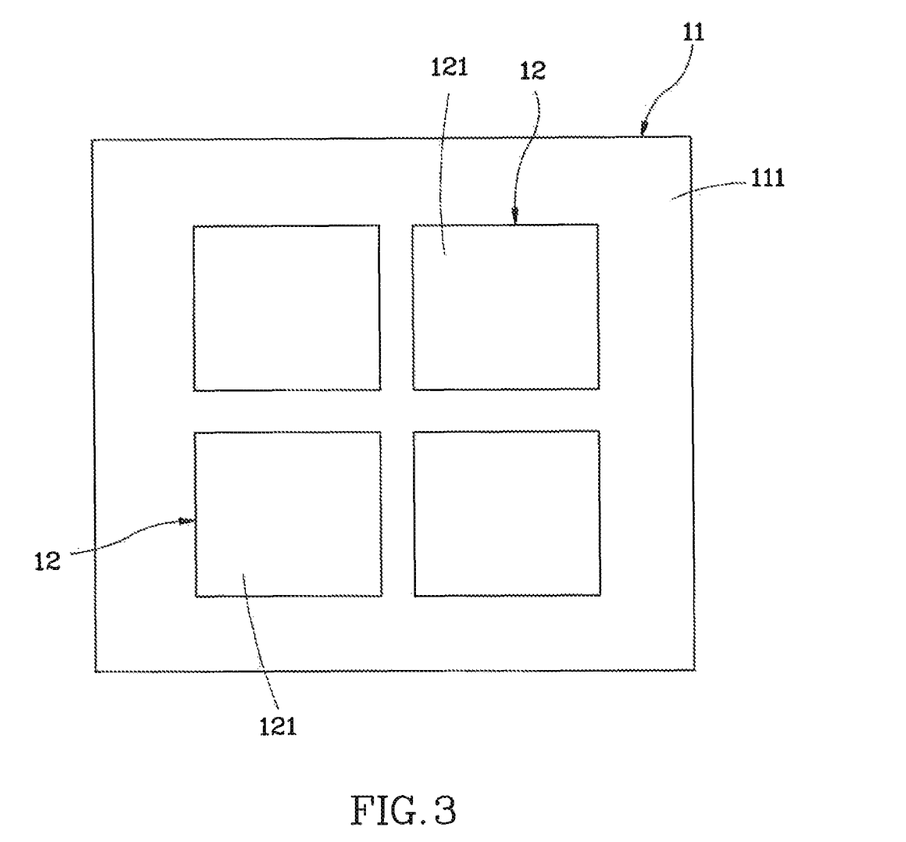
FIG. 3 and FIG. 4 are respectively a schematic top view and a schematic sectional view showing a step (a) of a method of manufacturing the space transformer for the probe card according to the preferred embodiment of the present invention.
Figure 4:
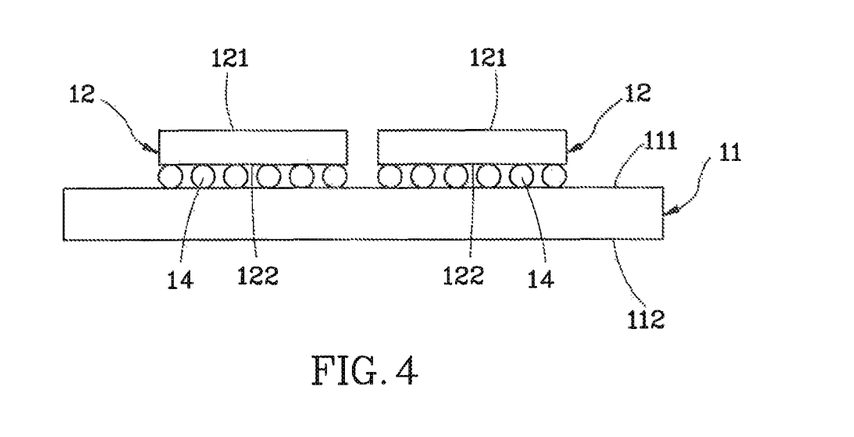

(a) Fixedly mount the second substrates 12 on the first substrate 11 in a way that the first substrate 11 is electrically connected with the second substrates 12, as shown in FIG. 3 and FIG. 4, which are respectively a schematic top view and a schematic sectional view showing this step.

Specifically speaking, each of the first and second substrates 11, 12 has a top surface 111, 121 and a bottom surface 112, 122; each of the top and bottom surfaces 111, 112, 121, 122 has a plurality of contact pads (not shown). It is to be understood. that the top contact pads on the top surface and the bottom contact pads on the bottom surface of the first substrate 11 have different intervals and are electrically and respectively connected through internal circuits built inside the first substrate 11, and in addition each second substrate 12 has a structure similar to that of the first substrate 11. In this embodiment, the top contact pads of the first substrate 11 have an interval smaller than the interval of the bottom contact pads of the first substrate 11. It is to be thither mentioned that in this embodiment, the words "top" and "bottom" are recited according to the status shown in figures, not the status of the space transformer 10 in actual usage. The bottom contact pads provided at the bottom surface 122 of each second substrate 12 are electrically bonded to the top contact pads at the top surface 111 of the first substrate 11 through solder balls 14 of a ball grid array (BGA) by reflow soldering.

The first substrate 11 and each of the second substrates 12 can be a multi-layered ceramic (MLC) board and a multi-layered organic (MLO) board respectively so that the first substrate 11 is structurally stronger than each second substrate 12. However, the first and second substrates 11, 12 are not limited to those kinds of boards disclosed herein. In this embodiment, four second substrates 12 are provided in this step, meaning that the space transformer 10 is made for the probe card capable of probing four devices under test at the same tune. However, the amount of the second substrates 12 can be modified according actual requirements.

Figure 5:
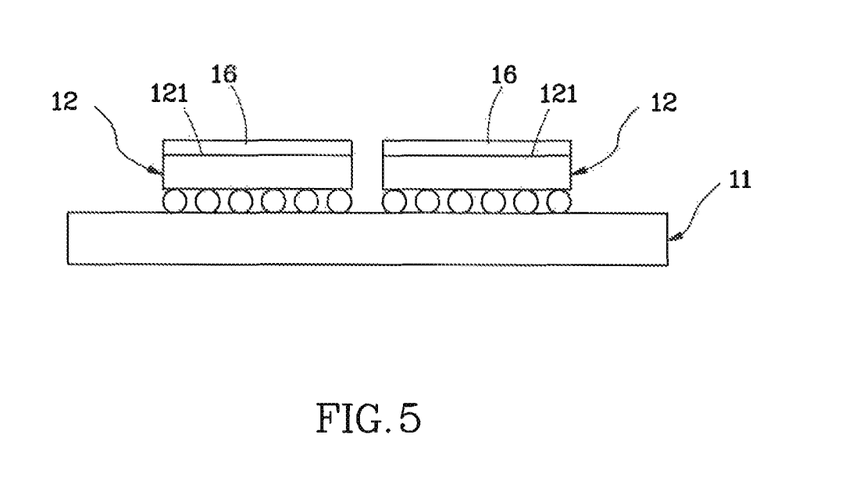
FIGS. 5-7 are schematic sectional views showing a process of a step (b) of the method of manufacturing the space transformer for the probe card according to the preferred embodiment of the present invention.
Figure 6:
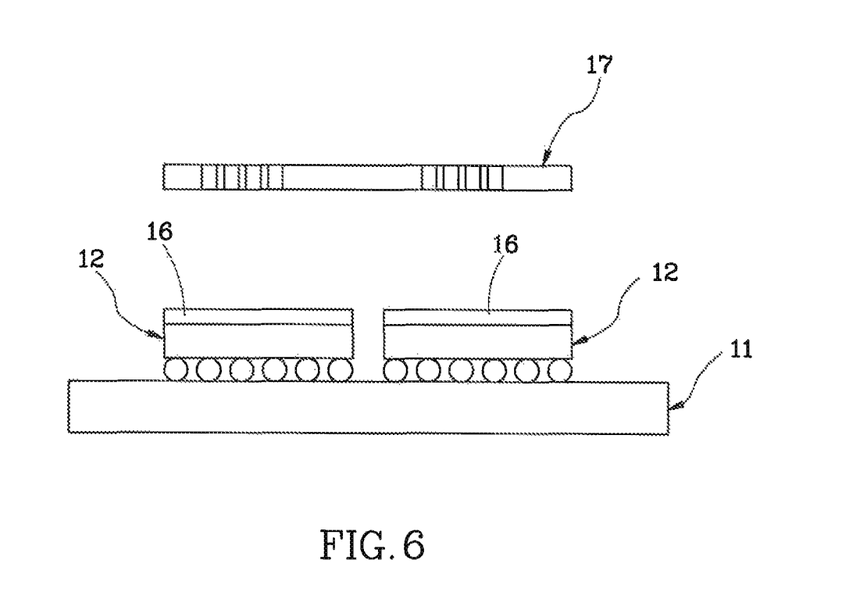
Figure 7:
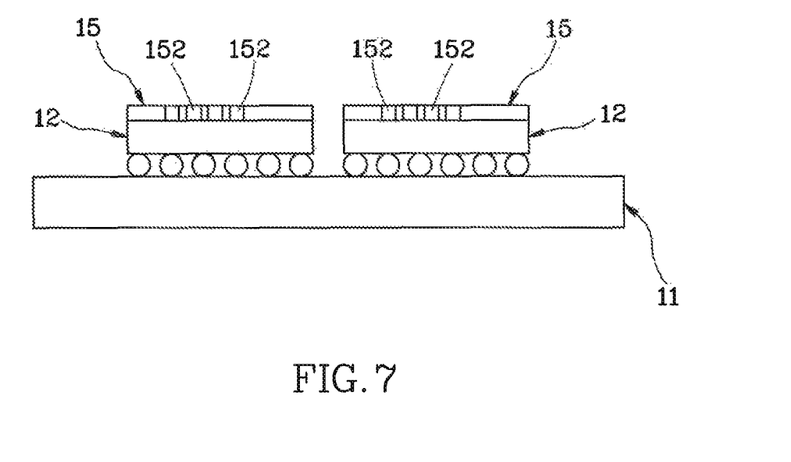

(b) Use photolithography to form an insulated layer 15 having a plurality of through holes 152 on each of the second substrates 12, as shown in FIGS. 5-7 which are schematic sectional views showing this step.

Specifically speaking, this step is carried out by coating the top surface 121 of each second substrate 12 with a layer of photoresist 16 as shown in FIG. 5, then disposing a mask 17 above the layers of photoresist 16 and exposing the layers of photoresist 16 to UV light passing through the mask 17 as shown in FIG. 6, and finally developing the layers of photoresist 16 to form the insulated layers 15 each having the through holes 152 arranged in a specific pattern, as shown in FIG. 7. It is to be understood that the mask 17 is configured corresponding to the electrically conductive blocks 13 demanded to be formed in the space transformer 10. This means the mask 17 has a pattern corresponding to a pattern of the contacts of the devices to be tested. In this way, the insulated layers 15 obtained from the layers of the photoresist 16 after development will have the through holes 152 arranged in positions substantially corresponding to the positions of the contacts of the devices to be tested. In addition, the through holes 152 of insulated layers 15 are communicated with the top contact pads provided at the top surfaces 121 of the second substrates 12, respectively.

Figure 8:
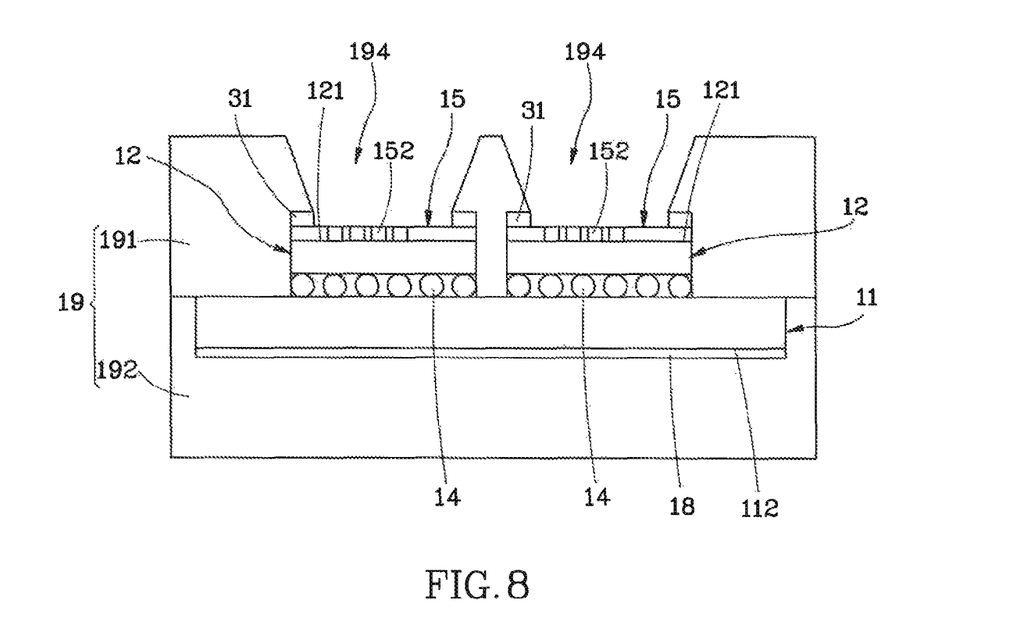
FIGS. 8-10 are schematic sectional views showing a process of a step (c) of the method of manufacturing the space transformer for the probe card according to the preferred embodiment of the present invention.
Figure 9:
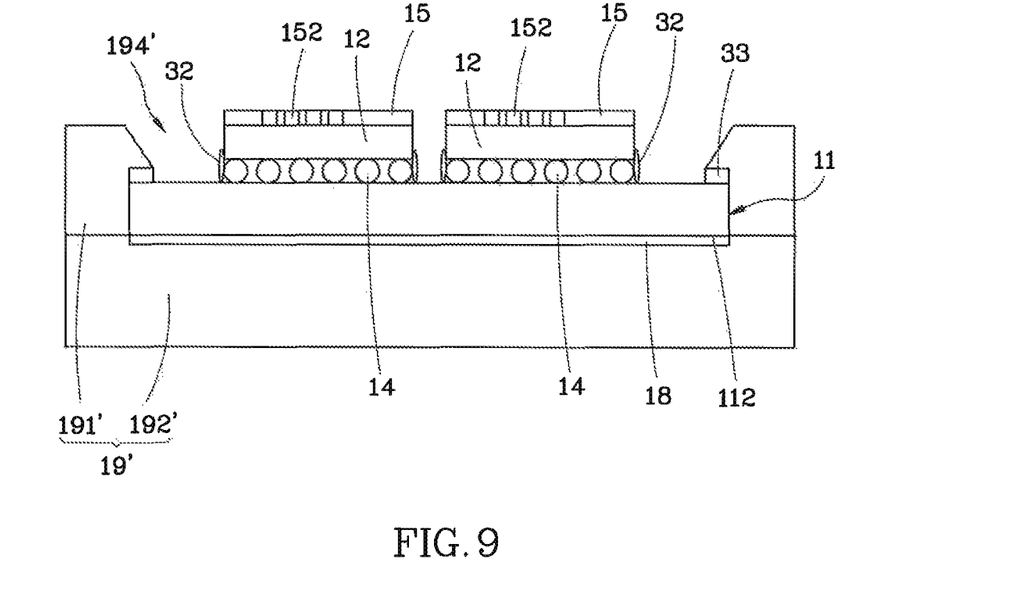
Figure 10:
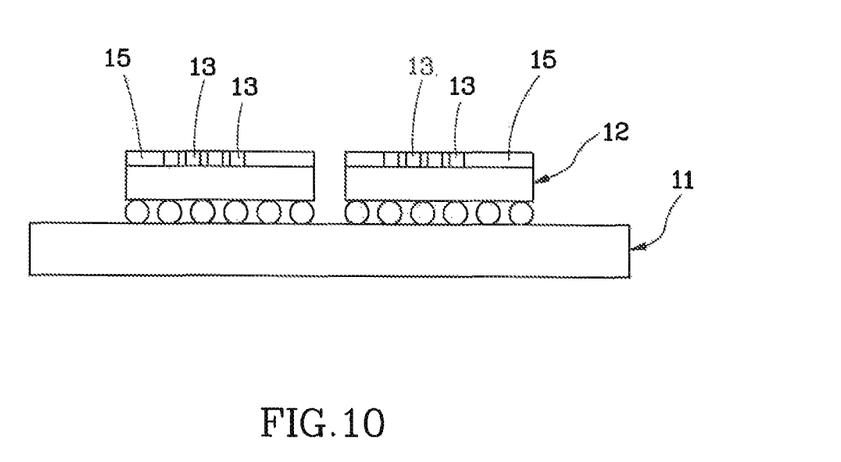

(c) Form the electrically conductive blocks 13 in the through holes 152 respectively in a way that each of the electrically conductive blocks 13 is fixedly bonded to and electrically connected with one top contact pad on the top surface of one of the second substrates 12, as shown in FIG. 10. The electrically conductive blocks 13 can be formed by electroplating in either of two ways shown in FIG. 8 and FIG. 9, respectively. FIGS. 8-10 are schematic sectional views showing this step.

In the way shown in FIG. 8, a conductor 18, such as a copper sheet, and a jig tool 19 are disposed in a way that the conductor 18 is electrically connected with the bottom contact pads at the bottom surface 112 of the first substrate 11 and the jig tool. 19 covers the conductor 18, the first substrate 11, and junctures of the first substrate 11 and the second substrates 12, i.e. the solder balls 14 and the contact pads connected with the solder balls 14. The jig tool 19 is, but not limited to be, composed of an upper member 191 and a lower member 192 combinedly forming a plurality of accommodating troughs 194 located on the insulated layers 15, respectively. The through holes 152 located in one of the insulated layers 15 communicate with the accommodating trough 194 located on the one of the insulated layers 15. After the conductor 18 and the jig tool 19 are installed, an electrolyte (not shown) is introduced into the accommodating troughs 194 so that the conductor 18 and each top contact pad at the top surfaces 121 of the second substrates 12 can serve as positive and negative electrodes for electroplating. In this way, the electrically conductive blocks 13 can be plated in the through holes 152 and bonded to the top contact pads of the second substrate 12, respectively. In this step, the solder balls 14, the contact pads connected with the solder balls 14, the bottom contact pads at the bottom surface 112 of the first substrate 11, and the conductor 18 are well protected by the jig tool 19 from damage due to contact of the electrolyte. In addition, the insulated layers 15 can be pressed by the jig tool 19 through a plurality of water-resisting members 31, such as O-rings, respectively so that the electrolyte is further prevented from flowing into the aforesaid members protected by the jig tool 19 through gaps between the jig tool 19 and the insulated layers 15.

In the way shown in FIG. 9, the first substrate 11 and each of the second substrates 12 are additionally adhered with a circle of water-resisting glue 32, such that the water-resisting glue 32 seals junctures of the first substrate 11 and the second substrates 12. In addition, a conductor 18 and a jig tool 19' are disposed in a way that the conductor 18 is electrically connected with the bottom contact pads at the bottom surface 112 of the first substrate 11 and covered by the jig tool 19'. The jig tool 19' is, but not limited to be, composed of an upper member 191' and a lower member 192', which combinedly form an accommodating trough 194' located on the first substrate 11 and accommodating all the second substrates 12. Thereafter, an electrolyte (not shown) is introduced into the accommodating trough 194', and then the electrically conductive blocks 13 can be plated in the through holes 152 of the insulated layers 15 by electroplating. It will be appreciated that when the electroplating process is performed, the whole device shown in FIG. 9 is immersed in the electrolyte; therefore, even if the top of the accommodating trough 194' is lower than the tops of the through holes 152, the through holes 152 can still be filled with electrolyte so that the electrically conductive blocks 13 can be plated in the through holes 152 by electroplating too.

In this way, the solder balls 14 and the contact pads connected with the solder balls 14 are protected by the water-resisting glue 32 from damage due to contact of the electrolyte. In addition, the bottom contact pads at the bottom surface 112 of the first substrate 11 and the conductor 18 are protected by the jig tool 19' from damage due to contact of the electrolyte. However, if gaps between the solder balls 14 and the surrounding of the solder balls 14 have been filled with insulated underfill material in the step (a), the water-resisting glue 32 can be eliminated in this step. In addition, the first substrate 11 can be pressed by the jig tool 19' through a water-resisting member 33, such as an O-ring, so that the electrolyte can further be prevented from flowing into the aforesaid members protected by the jig tool 19' through gaps between the jig tool 19' and the first substrate 11.

(d) Remove the insulated layers 15 so that the space transformer 10 shown in FIG. 1 is obtained. However, the method of the present invention can have no such step (d), meaning that the insulated layers 15 can be retained for the sake of enhancing structural strength of the electrically conductive blocks 13.

In the method of manufacturing the space transformer for the probe card provided by the present invention, the electrically conductive blocks 13 are formed after the first and second substrates 11, 12 are fixedly mounted together, so that any unexpected relative displacement of the first and second substrates 11, 12 during mounting is uninfluential to positions of the electrically conductive blocks 13. As long as the electrically conductive blocks 13 are formed at the positions demanded for installation of the probe needles 24, after the probe needles 24 are connected with the electrically conductive blocks 13, they will be located at positions corresponding to the positions of the contacts of the devices to be tested accurately.

The aforesaid method can further comprise a step of planarizing the electrically conductive blocks 13 after the step (c) and before the step (d). As mentioned above, the step (d) can be omitted so that the insulated layers 15 are retained on the second substrates 12 to reinforce bonding forces of the electrically conductive blocks 13. By means of planarization, even if the electrically conductive blocks 13 are formed with different shapes or inclinations resulted from the fact that the second substrates are inclinedly mounted to the first substrate 11, the top surfaces 132 of the electrically conductive blocks 13, which are to be connected with the probe needles 24, will be evenly distributed on a horizontal plane so that probing tips 242 of the probe needles 24 can be arranged with a good flatness after the probe needles 24 are connected with the top surfaces 132 of the electrically conductive blocks 13, respectively.

In conclusion, the method of manufacturing a space transformer for a probe card provided by the present invention is adapted to manufacture the space transformer composed of a plurality of substrates of a two-tier format. The method is primarily characterized in that electrically conductive blocks of the space transformer for connection with probe needles are formed after the first and second substrates are fixedly mounted together, and in addition a planarizing process can be optionally adopted after the electrically conductive blocks are formed. As a result, the probe needles, after they are connected to the electrically conductive blocks of the space transformer of the present invention, don't need to adjust the positions and flatness thereof, thereby simplifying the manufacturing process of the probe card.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method of manufacturing a space transformer for a probe card, said method comprising the steps of:
   (a) mounting and electrically connecting a plurality of second substrates on a first substrate;
   (b) forming an insulated layer having a plurality of through holes on each of the second substrates by photolithography; and
   (c) forming a plurality of electrically conductive blocks in the through holes respectively in a way that each of the electrically conductive blocks is fixedly bonded to and electrically connected with one of the second substrates, wherein
   the electrically conductive blocks are formed by electroplating in the step (c), and
   the step (c) is carried out by disposing a conductor and a jig tool having at least one accommodating trough in a way that the conductor is electrically connected with the first substrate and covered by the jig tool, introducing an electrolyte into the at least one accommodating trough, and forming the electrically conductive blocks in the through holes of the insulated layers by the electroplating.

2. The method as claimed in claim 1, further comprising a step of planarizing the electrically conductive blocks after the step (c).

3. The method as claimed in claim 1, wherein the first substrate is a multi-layered ceramic board; each of the second substrates is a multi-layered organic board.

4. The method as claimed in claim 1, wherein the jig tool comprises an upper member and a lower member; in the step (c), the first substrate and the conductor are clamped between the upper member and the lower member.

5. The method as claimed in claim 1, wherein the first substrate and junctures of the first substrate and the second substrates are covered by the jig tool in the step (c); the jig tool has a plurality of said accommodating troughs which are located on the insulated layers, respectively.

6. The method as claimed in claim 5, wherein the insulated layers are pressed by the jig tool through a plurality of water-resisting members respectively in the step (c).

7. The method as claimed in claim 1, wherein the second substrates are accommodated in a single said accommodating trough in the step (c).

8. The method as claimed in claim 7, wherein the first substrate is pressed by the jig tool through a water-resisting member in the step (c).

9. The method as claimed in claim 7, wherein before the electrolyte is introduced into the accommodating trough in the step (c), the first substrate and each of the second substrates are adhered together with water-resisting glue in a way that the water-resisting glue seals junctures of the first substrate and the second substrates so that the electrolyte is prevented from contact of the junctures of the first substrate and the second substrates.

10. The method as claimed in claim 1, further comprising a step (d) of removing the insulated layers after the step (c).

11. The method as claimed in claim 1, wherein in the step (a) the first substrate is provided at a bottom surface thereof with bottom contact pads and at a top surface thereof with top contact pads electrically and respectively connected with the bottom contact pads and having an interval smaller than an interval of the bottom contact pads; each of the second substrates is provided at a top surface thereof with top contact pads and at a bottom surface thereof with bottom contact pads electrically and respectively connected with the top contact pads of said second substrate; the second substrates are mounted on the top surface of the first substrate in a way that the bottom contact pads of the second substrates are electrically and respectively connected with the top contact pads of the first substrate by reflow soldering.

12. The method as claimed in claim 11, wherein in the step (b) the through holes of the insulted layer on each of the second substrates are configured having a pattern conformable to a pattern of contacts of a device to be tested.

13. The method as claimed in claim 12, wherein in the step (b) the through holes of the insulted layer on each of the second substrates are formed in a way that the through holes of the insulted layer are communicated with the top contact pads of the associated second substrate, respectively.

14. The method as claimed in claim 1, wherein in the step (a) each of the second substrates is provided at a top surface thereof with top contact pads electrically connected with the first substrate; in the step (b) the through holes of the insulted layer on each of the second substrates are configured having a pattern conformable to a pattern of contacts of a device to be tested in a way that the through holes of the insulted layer on each of the second substrates are communicated with the top contact pads of the associated second substrate, respectively.

* * * * *